(12) United States Patent
Yang

(10) Patent No.: US 6,293,898 B1
(45) Date of Patent: Sep. 25, 2001

(54) HOLOGRAPHIC MEMORY

(75) Inventor: Keun Young Yang, Kyonggi-do (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 09/382,692

(22) Filed: Aug. 25, 1999

(30) Foreign Application Priority Data

Sep. 3, 1998 (KR) .................................. 98-36344

(51) Int. Cl.[7] .................................................. G03H 1/26
(52) U.S. Cl. ............................. 559/22; 359/15; 359/25; 359/30
(58) Field of Search ............................. 359/15, 22, 24, 359/25, 30, 35

(56) References Cited

U.S. PATENT DOCUMENTS 3,936,139 * 2/1976 Huignard et al. ................ 359/22
5,946,115 * 8/1999 Noh ................................... 359/22

FOREIGN PATENT DOCUMENTS

1412526 * 11/1975 (GB) ................................. 359/22

* cited by examiner

Primary Examiner—Darren Schuberg
(74) Attorney, Agent, or Firm—Fleshner & Kim, LLP

(57) ABSTRACT

Holographic memory including a plurality of HOEs stacked in a vertical direction for two dimensional addressing of a recording medium for increasing a recording capacity and improving productivity and cost.

18 Claims, 10 Drawing Sheets

HOLOGRAPHIC MEMORY

BACKGROUND OF THE INVENTION

1. Field of the Invention

The present invention relates to a holographic memory.

2. Background of the Related Art

As large scale recording and reproduction of information is required, optical information recording/reproduction technologies which can make three dimensional information recording/reproduction using holography is under development recently in addition to two dimensional recording/reproduction devices that use optical disk recording medium, such as CD and DVD and the like.

Referring to FIG. 1, the in-formation recording/reproduction device using holography is provided with a laser 15 for a light source, and a beam splitter 14 for splitting a beam 16 from the laser 15 into a reference beam 6 and an object beam 7. The reference beam part is provided with in an order of a beam expander 12 for expanding a diameter of the reference beam 6, a beam deflector 11 for directing the reference beam 6 expanded by the beam expander 12 toward a telescope 9 with an 1:1 magnifying power and changing an incident angle to the telescope 9, and the telescope 9 for forming an image of a reflecting plane of the beam deflector 11 on a recording medium 3, and the object beam part is provided with in an order of a beam interrupter 17 for controlling advance of the beam, a beam expander 13 for expanding a diameter of the object beam 7, a reflector 10 for deflecting a direction of beam an SLM(Spatial Light Modulator) 1 for displaying information, an FTL(Fourier Transform Lens) 2 for subjecting an image displayed on the SLM 1 to Fourier transform onto the recording medium 3. The recording medium 3 is disposed at a place the reference beam 6 and the object beam 7 are met, an image forming lens 4 is provided at a place a given distance away from the recording medium 3 in the direction of the object beam 7, a CCD)(Charge Coupled Device) 5 is provided at an image forming plane of the image forming lens 4 for converting an image from the SLM 1 into an electrical signal, and the SLM 1 and the CCD 5 are put under the control of a computer 8.

The operation of the aforementioned holographic memory will be explained.

Upon displaying information on the SLM 8 by the computer 8 and directing the reference beam 6 and the object beam 7 to the recording medium 3 on the same time, the object beam 7 and the reference beam 6 make an interference, to form an interference pattern, which is recorded on the recording medium 3. After the recording, if the object beam 7 is interrupted by the beam interrupter 17 while the reference beam 6 is directed to the recording medium 3, the reference beam 6 is diffracted by the interference pattern recorded on the recording medium 3, to reproduce the object beam 7 which advances in the direction of the CCD 5. If the object beam 7 is made to form an image on the CCD 5 through the image forming lens 4, the image displayed on the SLM 1 is formed on the CCD 5, and the computer 8 stores and analysis the electrical signal from the CCD 5. Another information may be recorded by displaying the another information on the SLM 1 and changing an angle of deflection of the beam deflector 11, wherein, even if the angle of deflection is changed by the beam deflector 11, an incident angle of the reference beam 6 to the recording medium 3 is changed while the image formation of the image formation plane on the recording medium 3 is maintained the same, because the telescope 9 positioned between the beam deflector 11 and the recording medium 3 has a magnifying power of 1:1. Eventually, the reference beams 6 having slightly different incident angles and the object beam 7 form slightly different interference patterns respectively at the same position of the recording medium 3, which are recorded on the recording medium 3. Therefore upon directing the reference beam 6 to the interference patterns overlapped at the same position, only the interference pattern formed by the reference beam 6 having the same incident angle with the reference beam 6 used in recording and the object beam 7 satisfies the Bragg condition, thereby reproducing only one object beam 7. That is by controlling an incident angle of the reference beam 6, the object beam 7 can be reproduced, selectively.

There have been a variety of studies for increasing a recording capacity of the memory using the aforementioned holography, a related art of which is illustrated in FIG. 2. The device illustrated in FIG. 2 is the related art device shown in FIG. 1 added with beam deflectors 18 and 19 for deflecting beam in a direction perpendicular to the direction of beam deflection of the beam deflector 11, i.e., at a xz-plane. As shown in FIGS. 3A and 3B, information is recorded on the recording medium 3 dividing the recording medium in a z-axis direction, for increasing a recording capacity.

However, since the technology utilizes the recording medium 3 only one dimensionally too, the technology has a limitation in increasing the recording capacity.

SUMMARY OF THE INVENTION

Accordingly, the present invention is directed to a holographic memory that substantially obviates one or more of the problems due to limitations and disadvantages of the related art.

An object of the present invention is to provide a holographic memory which can increase a recording capacity by using an HOE(Holographic Optical Element).

Another object of the present invention is to provide a holographic memory at a low cost.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the holographic memory includes a light source for emitting a beam, a beam splitter for splitting the beam into a reference beam and an object beam, a hologram memory unit for recording information on a cell to which the reference beam and the object beam are incident together, and reproducing information recorded previously when only the reference beam is incident thereto, a first beam path changing unit for directing the reference beam to an arbitrary direction for recording and reproducing the information, a composite HOE having a plurality of HOEs (Holographic Optical Element) stacked in a vertical direction each for diffracting the reference beam from the first beam path changing unit toward an arbitrary cell of the hologram memory unit, and a second beam path changing unit for adjusting a beam path of the object beam such that the object beam is incident to the hologram memory unit for recording the information.

The first beam path changing unit includes a beam expander for expanding a diameter of the reference beam split at the beam splitter, a reflector for changing a direction of advance of the reference beam expanded at the beam expander, a first beam deflector for deflecting the reference beam reflected at the reflector to an arbitrary direction, and a second beam deflector for re-deflecting the reference beam deflected at the first beam deflector perpendicular to a deflection direction of the first beam deflector.

The second beam path changing unit includes a first beam blocking unit for passing the object beam incident thereto in recording and blocking the object beam incident thereto in reproduction, a third beam deflector for deflecting the object beam passed through the beam blocking unit toward an arbitrary direction, a beam expander for expanding a diameter of the object beam deflected at the third beam deflector, a reflector for changing a direction of advance of the object beam expanded by the beam expander, a light modulator for displaying the object beam incident to the reflector, a lens for subjecting the object beam displayed on the light modulator to Fourier transformation, to provide to the hologram memory unit, and an optical detector for converting optical information reproduced from the hologram memory unit into an electrical signal in reproduction.

A recording capacity of the hologram memory unit is dependent on a number of the HOEs in the composite HOE.

Thus, the present invention can increase a recording capacity by making two dimensional addressing of the recording medium using a plurality of HOEs stacked in a vertical direction.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 1:
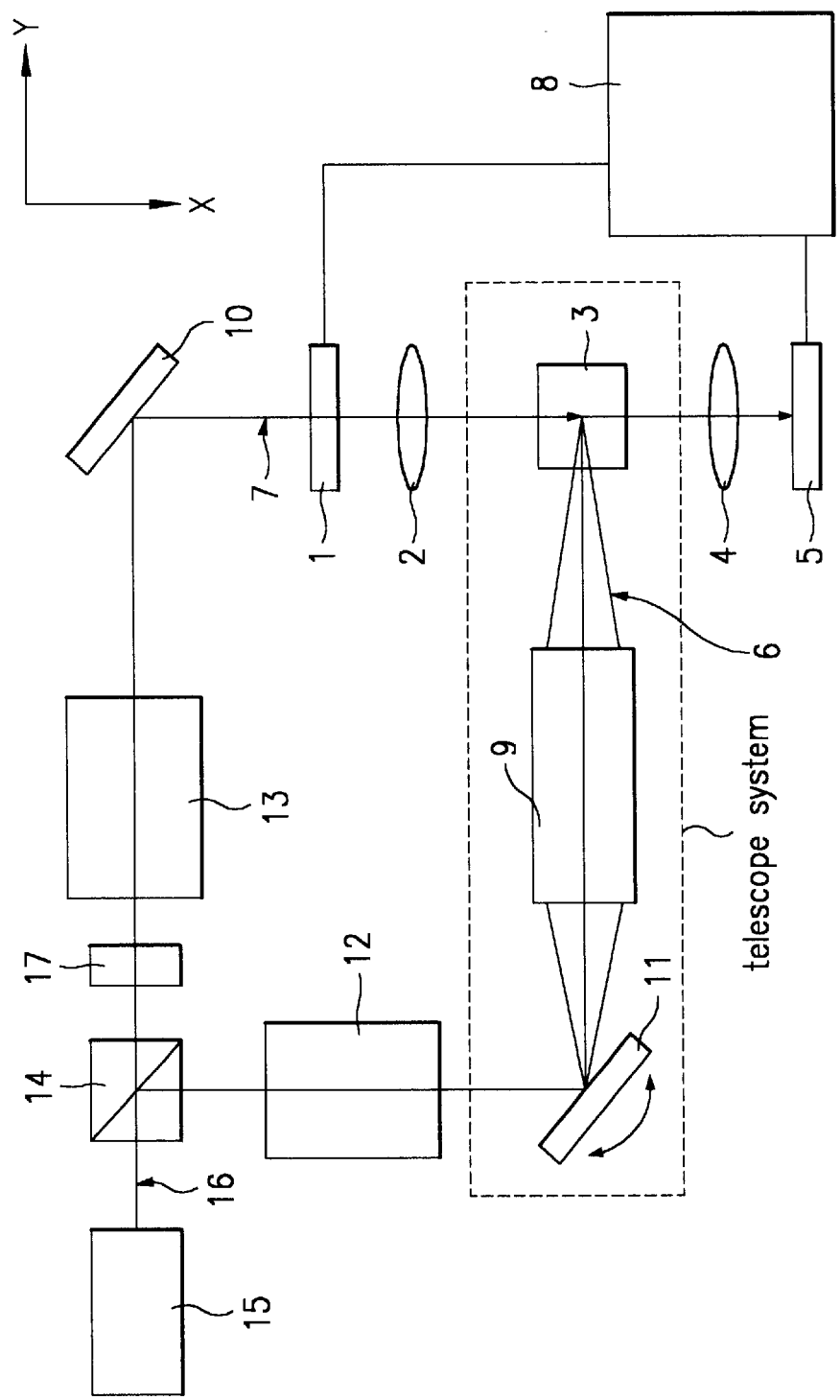
FIGS. 1 and 2 illustrate systems of related art holographic memories, respectively.
Figure 2:
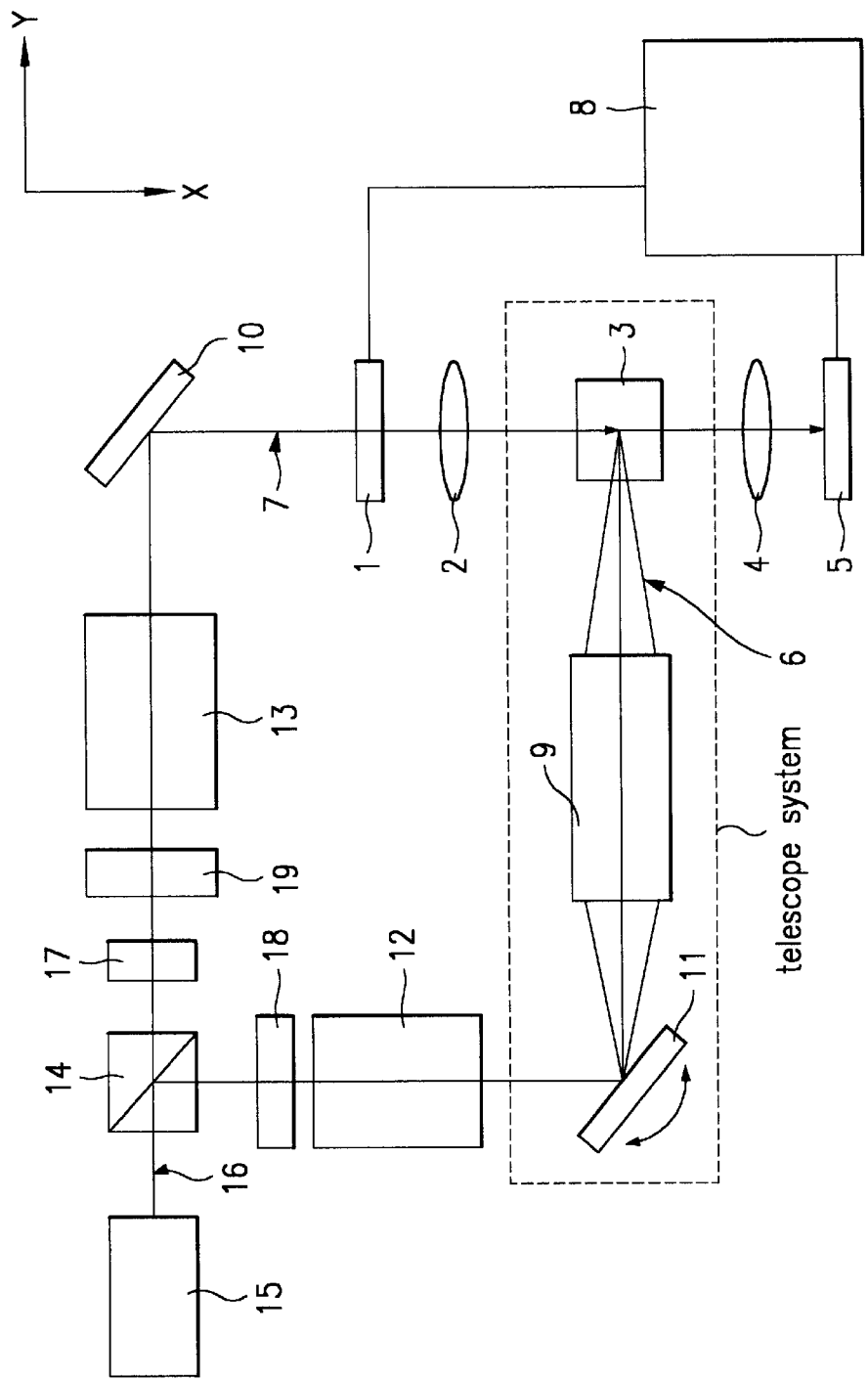
Figure 3A:
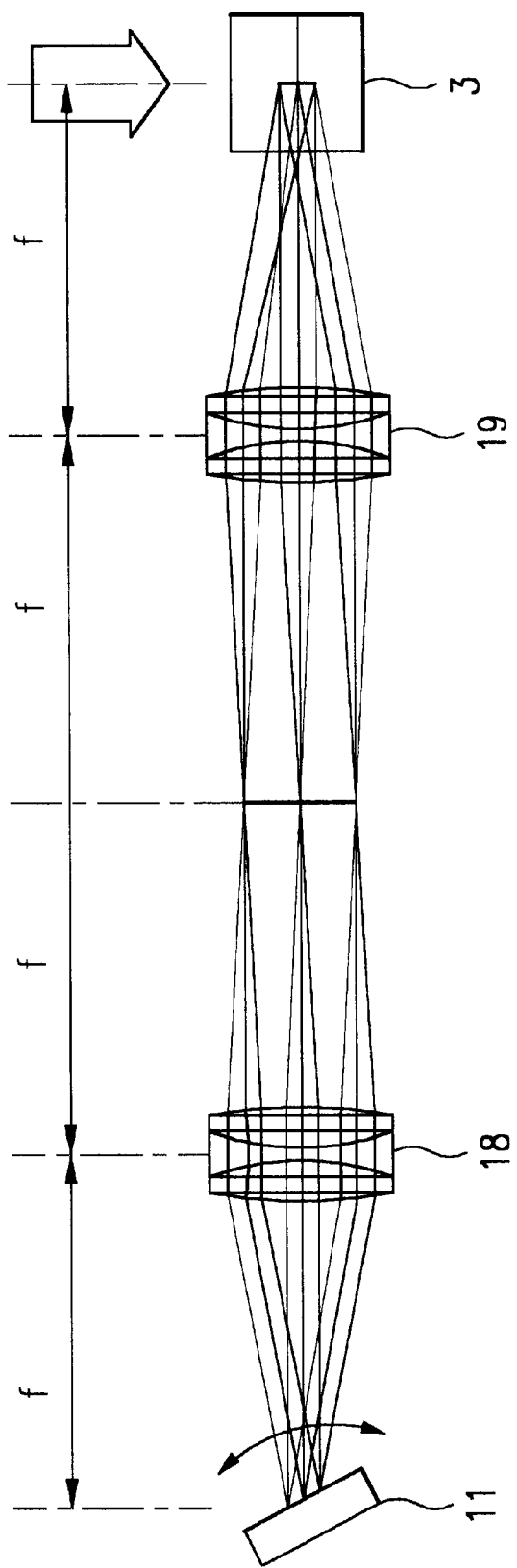
FIG. 3A illustrates light paths of the telescopic systems in FIGS. 1 and 2.
Figure 3B:
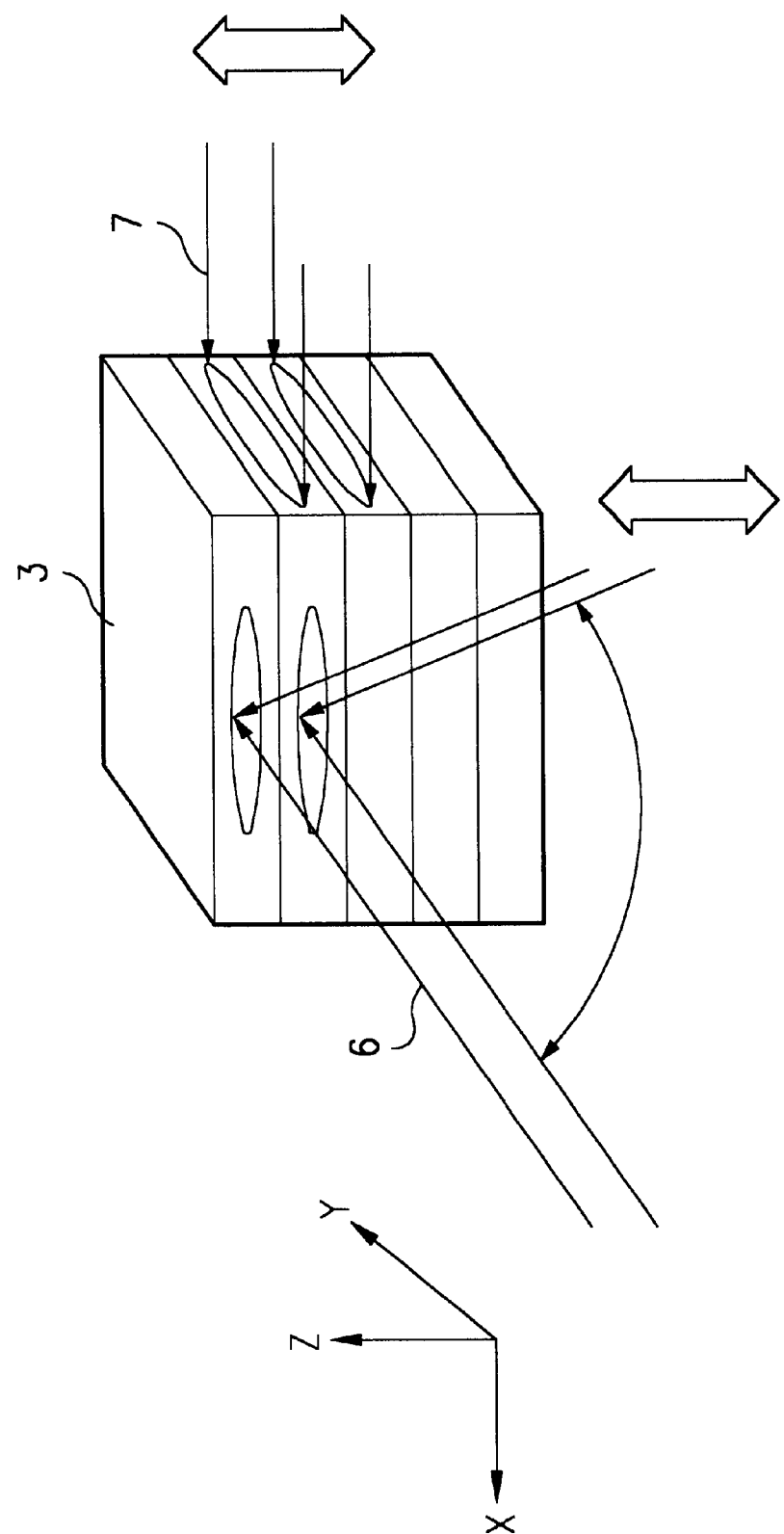
FIG. 3B illustrates a method for recording information on a recording medium shown in FIG. 3A.
Figure 4:
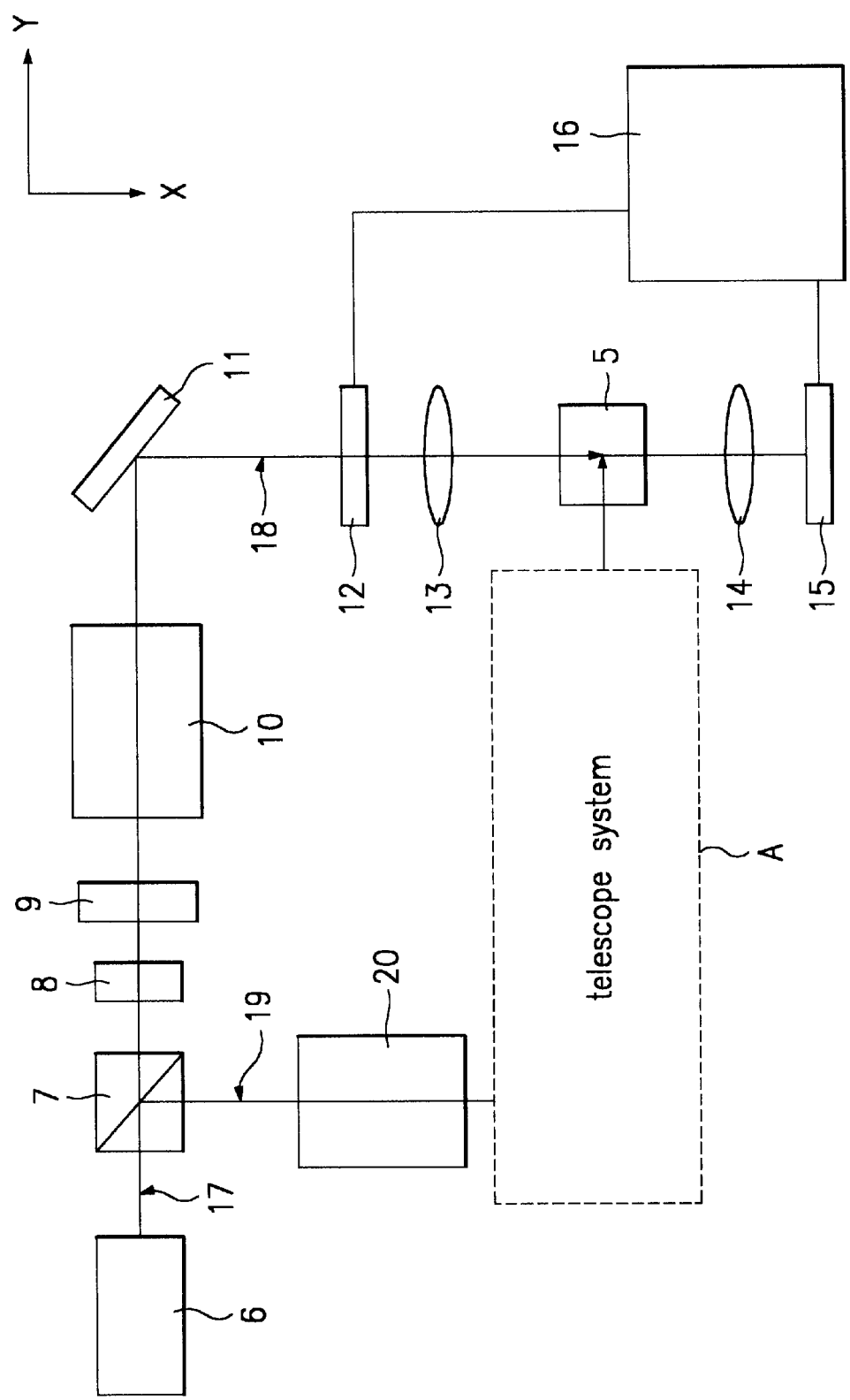
FIG. 4 illustrates a holographic memory in accordance With a preferred embodiment of the present invention.

Reference will now be made in detail to the preferred embodiments of the present invention examples of which are illustrated in the accompanying drawings. FIG. 4 illustrates a holographic memory in accordance with a preferred embodiment of the present invention, which is in general identical to the related art system shown in FIG. 2, except for the telescope system shown in dotted line in FIGS. 1 and 2.

Figure 5:
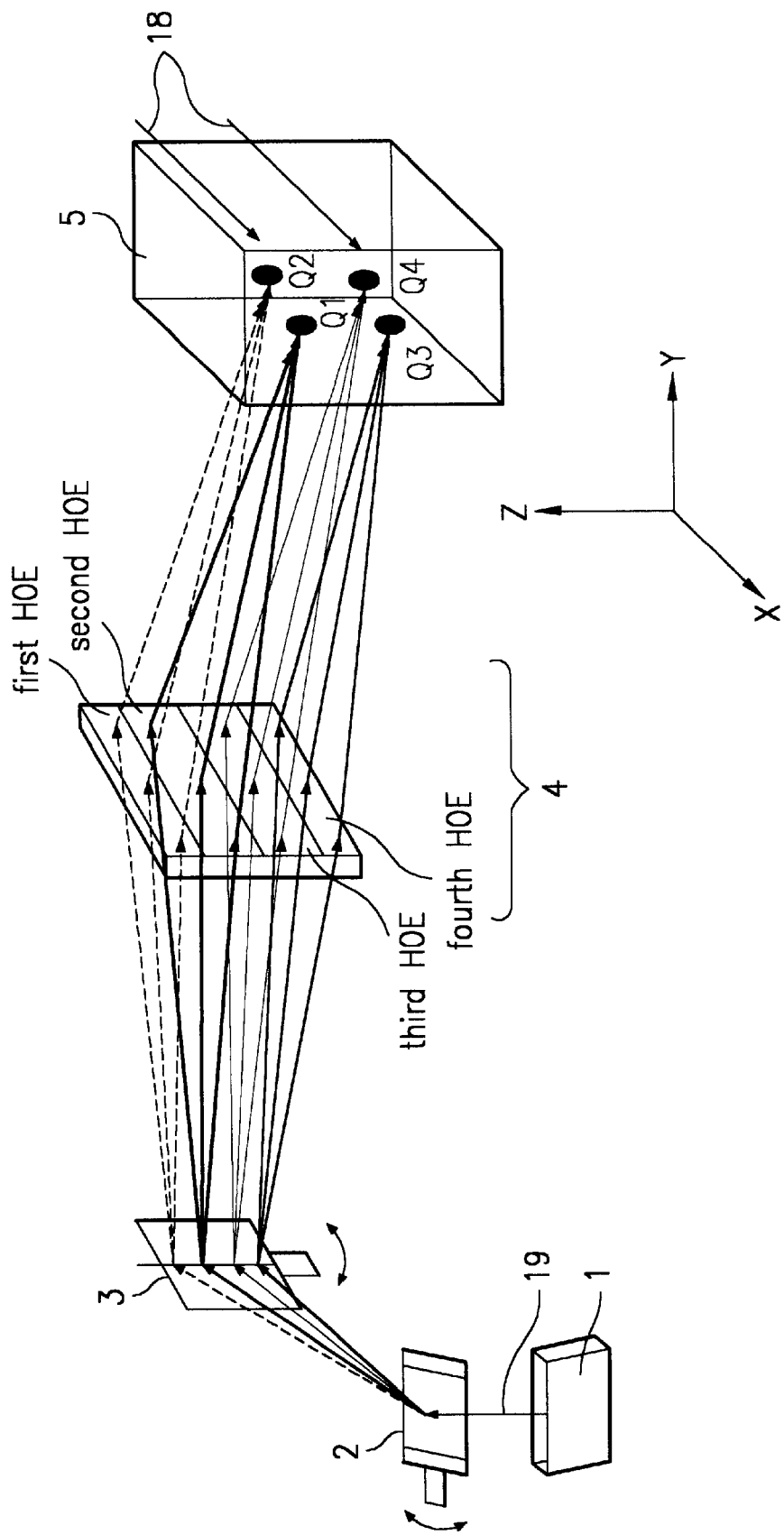
FIG. 5 illustrates a telescope system in FIG. 4.

Referring to FIG. 5, the telescope system of the present invention includes a reflector 1 for directing a beam toward a first beam deflector 2, a second beam deflector 3 for re-deflecting the beam deflected at the first beam deflector 2 in a direction(xy-plane) perpendicular to a deflection direction of the first beam deflector 2, and a hologram 4 for forming a reflection plane image of each of the first and second beam deflectors 2 and 3. The hologram 4 is a composite HOE(Holographic Optical Element) having at least one HOE. The HOEs are stacked in a vertical direction to form the composite HOE, and a recording density becomes the higher as a number of the HOEs are the more.

Each of HOEs in the composite HOE 4 is arranged such that the HOEs have relations of object beams and reference beams as shown in FIGS. 6, 7, 8A and 8B.

The reference beam RB for the first, second. third and fourth HOEs is a diverging beam diverging from a point Pi having an angle $\theta1'$ to an optical axis HAx on an xy-plane of a hologram plate HP and an angle $\theta i$ to the optical axis HAx on an yz-plane of the hologram plate HP and spaced a distance D1 away from the hologram plate, wherein the first, second, third and fourth HOEs are arranged such that the first HOE satisfies $\theta i=\theta 6$ and $D4=\tan\theta 6 \times D1$, the second HOE satisfies $\theta i=\theta 5$ and $D4=\tan\theta 5 \times D1$, the third HOE satisfies $\theta i=\theta 4$ and $D4=-\tan\theta 4 \times D1$, and the fourth HOE satisfies $\theta i=\theta 3$, $D4=-\tan\theta 3 \times D1$, and the object beam OB for the first, second, third and fourth HOEs is a converging beam converging onto a point Qi spaced by D3 from an optical axis having an angle $\theta 2'$ to the optical axis HAx on the xy-plane of the hologram plate HP and spaced by D5 from an optical axis HAz on the yz-plane of the hologram plate HP. Parameters defining the object beam and the reference beam for the first, second, third and fourth HOEs are made to have the following relations.

$\theta 1=\theta 1'$ $\theta 2=\theta 2'$

D1=L1, D2=L2

D4=L10, Qi=Q2, D3=L3, D5=L6, HAx=A×1 (for the first HOE),

D4=L8, Qi=Qi, D3=L4, D5=L6, HAx=A×2(for the second HOE), D4=L9, Qi=Q4, D3=L3, D5=L7, HAx=A×3(for the third HOE), D4=L11, Qi=Q3, D3=L4, D5=L7, HAx=A×4(for the fourth HOE).

Figure 6:
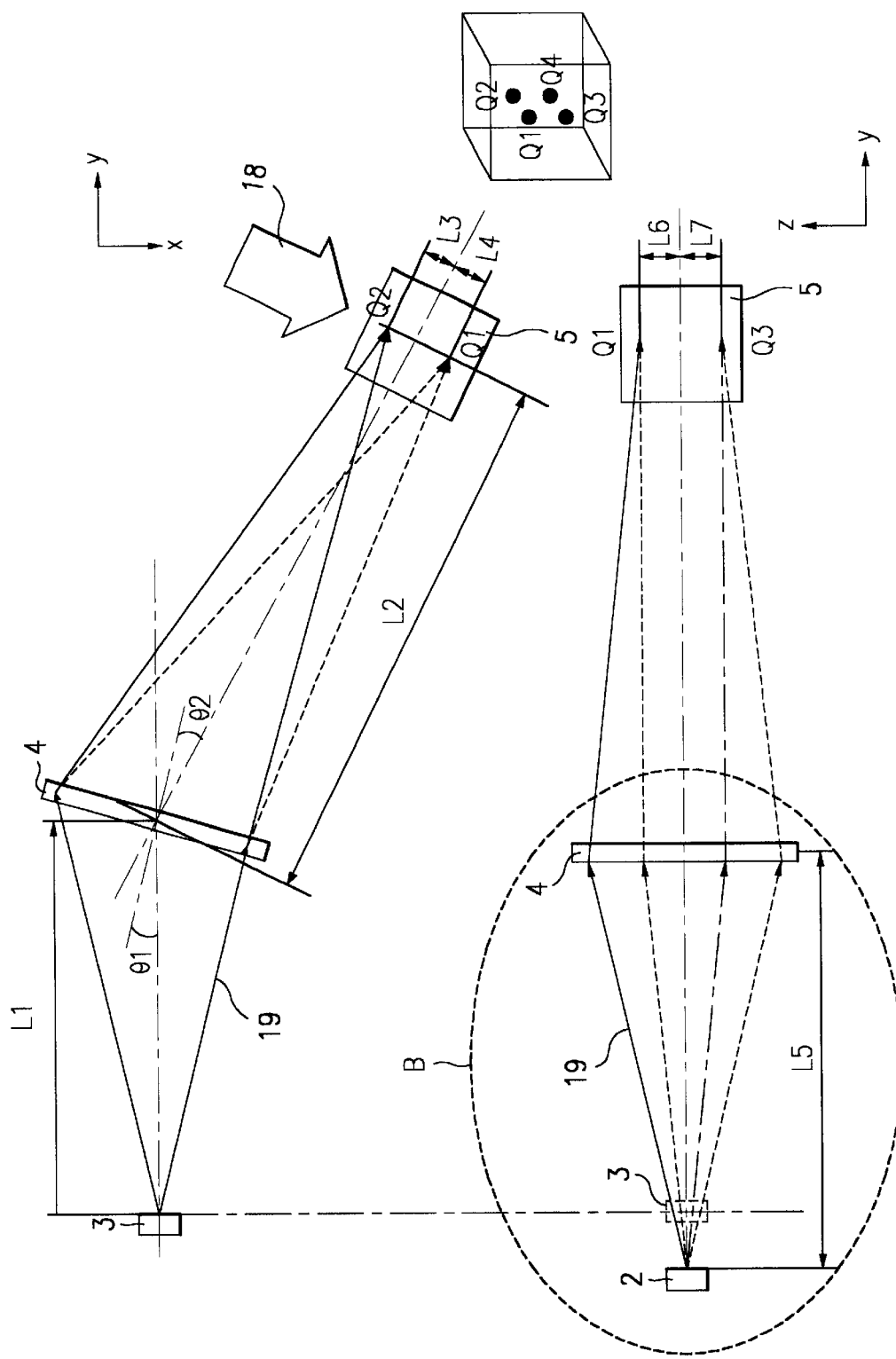
FIG. 6 illustrates operation of the optical system shown in FIG. 4.
Figure 7:
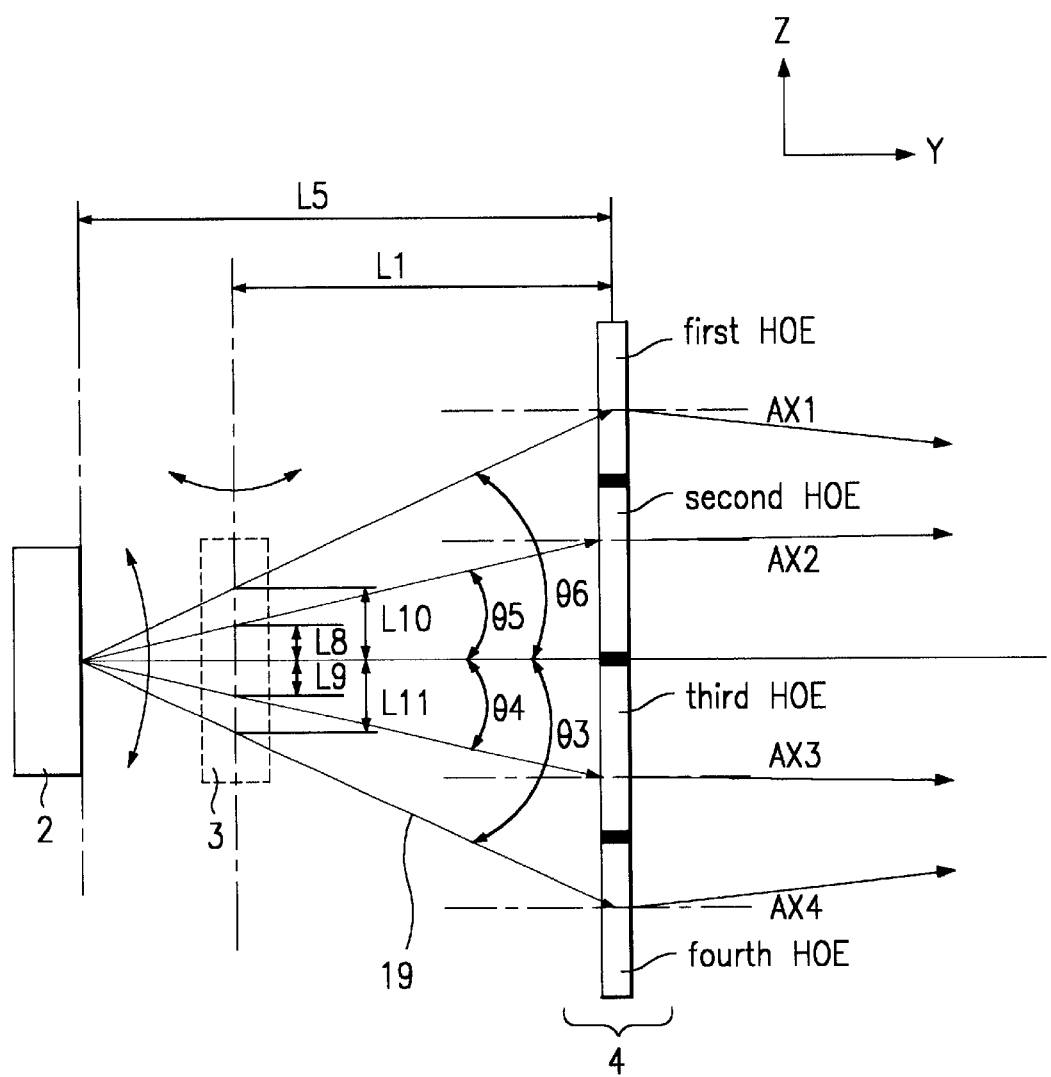
FIG. 7 illustrates a detail of "B" portion in FIG. 6.
Figure 8A:
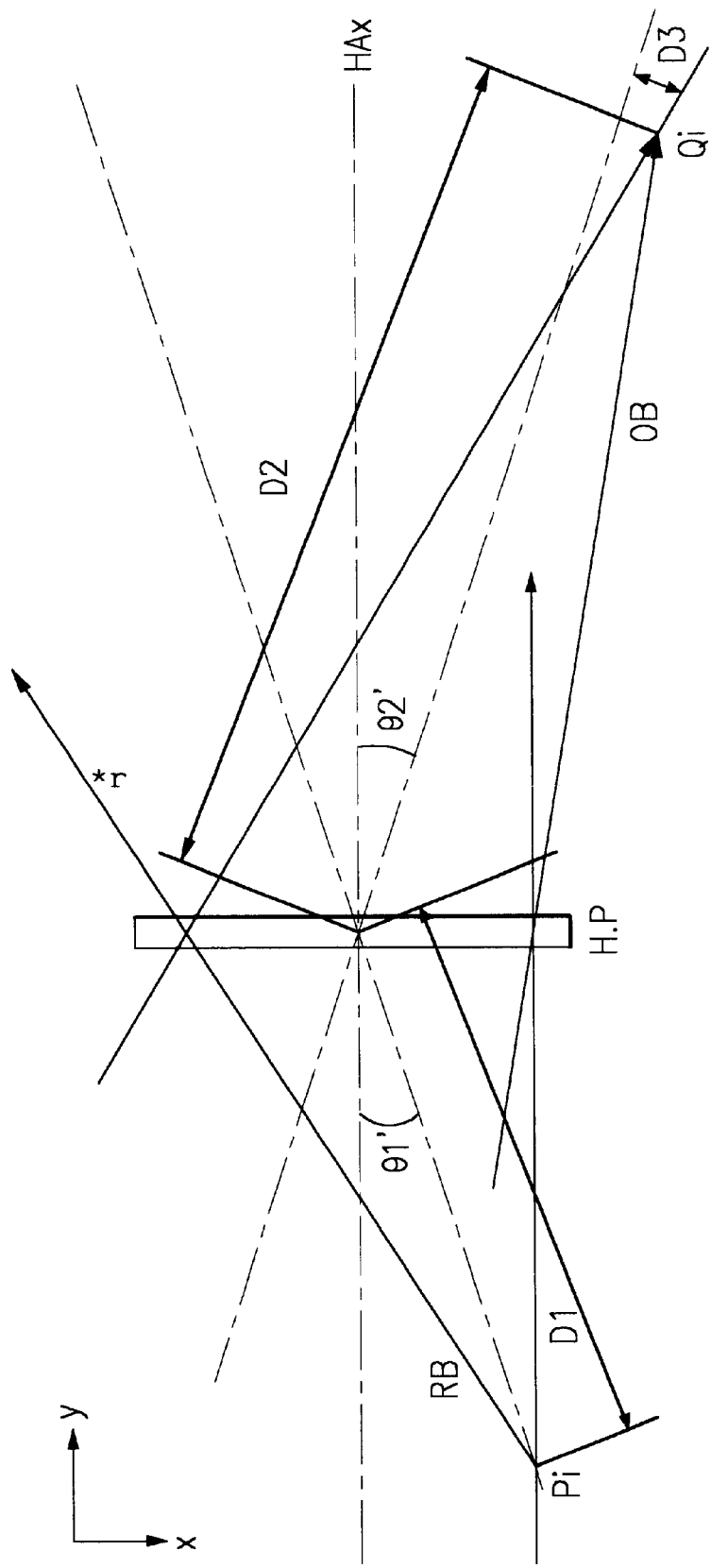
FIGS. 8A and 8B respectively illustrate a relation between an object beam and a reference beam of a composite HOE in FIG. 4.
Figure 8B:
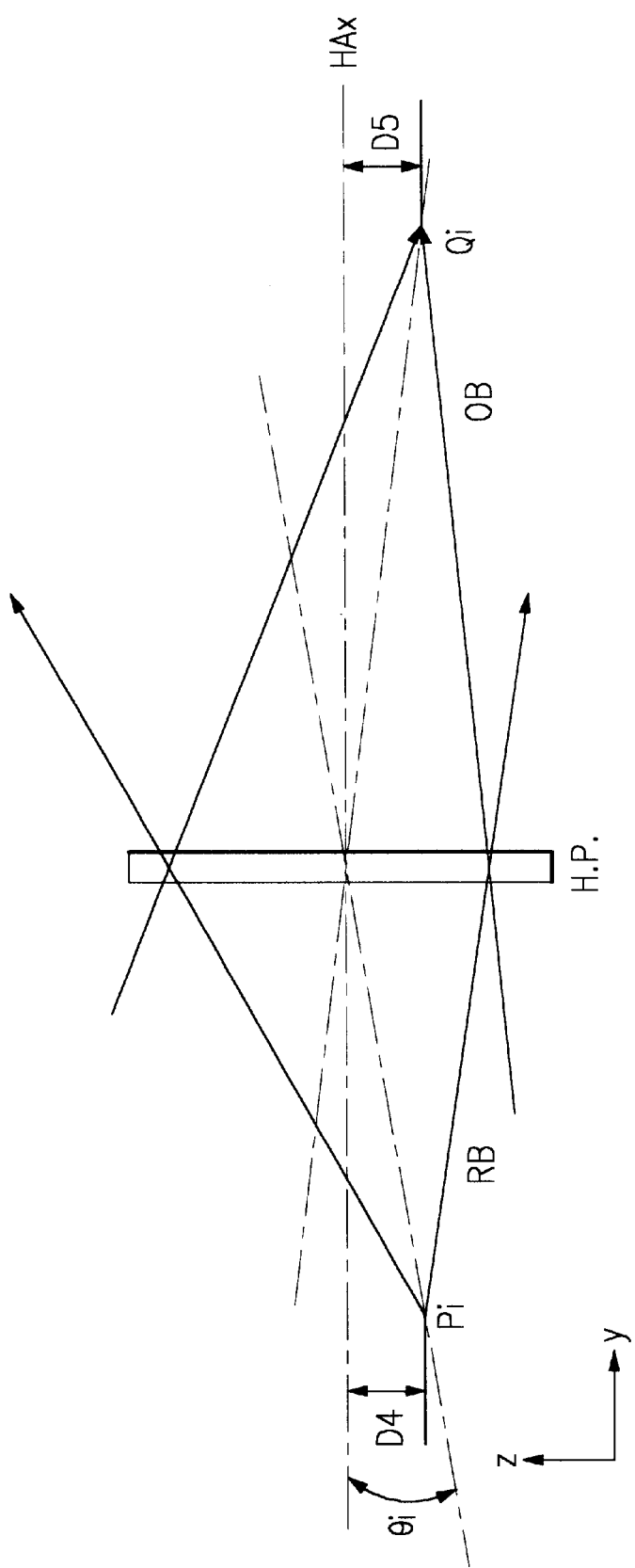

Referring to FIGS. 6 and 7, the telescope system of a magnifying power 1:1 having a composite HOE includes a first beam deflector 2 and a second beam deflector 3 spaced a fixed distance L5-L1, a composite HOE 4 disposed at a position spaced by L1 from the second beam deflector 3, and a recording medium 5 disposed at a position spaced by L2 from the composite HOE 4. The first HOE is disposed such that an optical axis AX1 thereof on a xy-plane has an angle $\theta 6$ to y-axis and a space thereof to y-axis in +z direction is $\tan\theta 6 \times L5$, the second HOE is disposed such that an optical axis AX2 thereof on a xy-plane has an angle $\theta 6$ to y-axis and a space thereofto y-axis in +z direction is $\tan\theta 5 \times L5$, the third HOE is disposed such that an optical axis AX3 thereof on a xy-plane has an angle $\theta 4$ to y-axis and a space thereof to y-axis in −z direction is $\tan\theta 4 \times L5$, and the fourth HOE is disposed such that an optical axis AX4 thereof on a xy-plane has an angle $\theta 3$ to y-axis and a space thereof to y-axis in -z direction is $\tan\theta 3 \times L5$.

Operation of the aforementioned holographic memory of the present invention will be explained. Basic operation of the holographic memory of the present invention is identical to the one of the related art, except that the telescope system of 1:1 magnifying power of the present invention uses a HOE which facilitates a two dimensional addressing to overcome a recording capacity limitation in the related art.

Referring to FIGS. 5~8, in a recording method using the telescope system(A) of the present invention, a laser beam 17 from a laser 6 is split into a reference beam 19 and an object beam 18 by a beam splitter 7, wherein the object beam 18 is incident to the recording medium 5 after passing through the third beam deflector 9, the second beam deflector 10, the second reflector 11, the SLM 12, and the FTL 13 in a sequence, and the reference beam 19 is incident to the recording medium 5 after passing through the first beam expander 20 and the telescope(A) of 1:1 magnifying power. In this instance, the third beam deflector 9 which deflects the object beam 18 on xz-plane deflects an image which is an SLM 12 image subjected to Fourier transformation by the FTL 13 such that the image is spaced by L6 in +z direction from a center axis of the recording medium 5, and the first deflector 2 which deflects the reference beam 19 on xz-plane deflects the reference beam 19 such that the reference beam 19 is incident to the first HOE at an angle θ6 to an optical axis AX1 of the first HOE. Then, the reference beam 19 is diffracted toward Q2 point on the recording medium at the first HOE, to cause an interference between the object beam 18 and the reference beam 19, of which pattern of interference is recorded on the recording medium 5. Next, the third beam deflector 9 which deflects the object beam 18 on xz-plane deflects an image which is an SLM 12 image subjected to Fourier transformation by the FTL 13 such that the image is spaced by L6 in +z direction from a center axis of the recording medium 5, and the first deflector 2 which deflects the reference beam 19 on xz-plane deflects the reference beam 19 such that the reference beam 19 is incident to the second HOE at an angle θ5 to an optical axis AX2 of the second HOE. Then, the reference beam 19 is diffracted toward Q1 point on the recording medium 5 at the second HOE, to cause an interference between the object beam 18 and the reference beam 19, of which pattern of interference is recorded on the recording medium 5. In the same fashion, an interference pattern is recorded on Q4 of the recording medium 5 by the third HOE, and an interference pattern is recorded on Q3 of the recording medium 5 by the fourth HOE. Therefore, information different for each other can be recorded on Q1, Q2, Q3 and Q4 of the recording medium 5, allowing an increase of recording capacity more than the related art. Though the hologram has four different HOEs in the explanation of the present invention, a number of the HOEs in the hologram may be increased, to increase the recording capacity more.

As has been explained, the holographic memory of the present invention has the following advantages.

First, the ability of two dimensional addressing of the reference beam on the recording medium permits to overcome a problem of the related art on a limitation of a recording capacity.

Second, the holographic memory of the present invention is significantly favorable in view of productivity and cost because the telescope system uses HOEs which are favorable in mass production instead of the precision lenses in the related art.

It will be apparent to those skilled in the art that various modifications and variations can be made in the holographic memory of the present invention without departing from the spirit or scope of the invention. Thus, it is intended that the present invention cover the modifications and variations of this invention provided they come within the scope of the appended claims and their equivalents.

What is claimed is:

1. A holographic memory, comprising:
    a light source for emitting a beam;
    a beam splitter for splitting the beam into a reference beam and an object beam;
    a hologram memory unit for recording information on a cell to which the reference beam and the object beam are incident together, and reproducing information recorded previously when only the reference beam is incident thereto;
    a first beam path changing unit for directing the reference beam to an arbitrary direction for recording and reproducing the information;
    a composite HOE having a plurality of HOEs (Holographic Optical Element) stacked in a vertical direction each for diffracting the reference beam from the first beam path changing unit toward an arbitrary cell of the hologram memory unit; and,
    a second beam path changing unit for adjusting a beam path of the object beam such that the object beam is incident to the hologram memory unit for recording the information;
    wherein the second beam path changing unit includes:
        a first beam blocking unit for passing the object beam incident thereto in recording and blocking the object beam incident thereto in reproduction;
        a beam deflector for deflecting the object beam passed through the beam blocking unit toward an arbitrary direction:
        a beam expander for expanding a diameter of the object beam deflected at the third beam deflector;
        a reflector for changing a direction of advance of the object beam expanded by the beam expander;
        a light modulator for displaying the object beam incident to the reflector;
        a lens for subjecting the object beam displayed on the light modulator to Fourier transformation, to provide to the hologram memory unit; and
        an optical detector for converting optical information reproduced from the hologram memory unit into an electrical signal in reproduction.

2. A holographic memory as claimed in claim 1, wherein the first beam path changing unit includes;
    a beam expander for expanding a diameter of the reference beam split at the beam splitter,
    a reflector for changing a direction of advance of the reference beam expanded at the beam expander;
    a first beam deflector for deflecting the reference beam reflected at the reflector to an arbitrary direction, and
    a second beam deflector for re-deflecting the reference beam deflected at the first beam deflector perpendicular to a deflection direction of the first beam deflector.

3. A holographic memory as claimed in claim 2, wherein the beam deflector in the second beam path changing unit has the same direction of deflection with the first beam deflector in the first beam path changing unit.

4. A holographic memory as claimed in claim 1, wherein the composite HOE has a first, a second a third and a fourth HOEs stacked in a vertical direction.

5. A holographic memory as claimed in claim 3, wherein the reference beam for the first, second, third and fourth HOEs is a diverging beam diverging from a position having an angle θ1' to an optical axis on an xy-plane of a hologram plate and an angle θi to the optical axis on an yz-plane of the hologram plate and spaced a distance D1 away from the hologram plate, wherein the first, second, third and fourth HOEs are arranged such that the first HOE satisfies θi=θ6 and D4=tan θ6×D1, the second HOE satisfies θi=θ5 and D4=tan θ5×D1, the third HOE satisfies θi=θ4 and D4=−tan θ4×D1, and the fourth HOE satisfies θi=θ3, D4=−tan θ3×D1 (where θ6 denotes an angle between an optical axis of the composite HOE and an optical axis of the first HOE on yz-plane, θ5 denotes an angle between an optical axis of the composite HOE and an optical axis of the second HOE on yz-plane, θ4 denotes an angle between an optical axis of the composite HOE and an optical axis of the third HOE on yz-plane, and θ3 denotes an angle between an optical axis of the composite HOE and an optical axis of the fourth HOE on yz-plane), and the object beam for the first, second, third and fourth HOEs is a converging beam converging onto a point Qi spaced by D3 from an optical axis having an angle θ2' to the optical axis on the xy-plane of the hologram plate and spaced by D5 from an optical axis on the yz-plane of the hologram plate.

6. A holographic memory as claimed in claim 4, wherein the first HOE is disposed such that an optical axis thereof on a xy-plane has an angle θ6 to y-ax is and a space thereof to y-axis in +z direction is tan θ6×L5, the second HOE is disposed such that an optical axis thereof on a xy-plane has an angle θ6 to y-axis and a space thereof to y-axis in +z direction is tan θ5×L5, the third HOE is disposed such that an optical axis thereof on a xy-plane has an angle θ4 to y-axis and a space thereof to y-axis in −z direction is tan θ4×L5, and the fourth HOE is disposed such that an optical axis thereof on a xy-plane has an angle θ3 to y-axis and a space thereof to y-axis in −z direction is tan θ3f×L5 (where L5 is a distance from the first beam deflector to the composite HOE).

7. A holographic memory as, claimed in claim 1, wherein a recording capacity of the hologram memory unit is dependent on a number of the HOEs in the composite HOE.

8. A holographic memory, comprising:
a light source for emitting a beam;
a beam splitter for splitting the beam into a reference beam and an object beam;
a hologram memory unit for recording information on a cell to which the reference beam and the object beam are incident together, and reproducing information recorded previously when only the reference beam is incident thereto;
a first beam path changing unit for directing the reference beam to an arbitrary direction for recording and reproducing the information which includes:
 a beam expander for expanding a diameter of the reference beam split at the beam splitter;
 a reflector for changing a direction of advance of the reference beam expanded at the beam expander; and
 a first beam deflector for deflecting the reference beam into a second beam deflector where the second beam deflector deflects the beam deflected at the first beam deflector in a direction perpendicular to a deflection direction of the first beam deflector;
 a composite HOE for forming a reflection plane image of each of the first and second beam deflectors having a plurality of HOEs (Holographic Optical Elements) successively stacked in a vertical direction each for diffracting the reference beam from the first beam path changing unit toward an arbitrary cell of the hologram memory unit; and
a second beam path changing unit for adjusting a beam path of the object beam such that the object beam is incident to the hologram memory unit for recording the information, comprising,
 a first beam blocking unit for passing the object beam incident thereto in recording and blocking the object beam incident thereto in reproduction;
 a third beam deflector for deflecting the object beam passed through the beam blocking unit toward an arbitrary direction;
 a beam expander for expanding a diameter of the object beam deflected at the third beam deflector;
 a reflector for changing a direction of advance of the object beam expanded by the beam expander;
 a light modulator for displaying the object beam incident to the reflector;
 a lens for subjecting the object beam displayed on the light modulator to Fourier transformation, to provide to the hologram memory unit; and
 an optical detector for converting optical information reproduced from the hologram memory unit into an electrical signal in reproduction.

9. A holographic memory as claimed in claim 8, wherein the composite HOE has a first, a second, a third and a fourth HOE successively stacked in a vertical direction.

10. A holographic memory as claimed in claim 9, wherein the reference beam for the first, second, third and fourth HOE is a diverging beam diverging from a position having an angle θ1F' to an optical axis on an xy-plane of a hologram plate and an angle θi to the optical axis on a yz-plane of the hologram plate and spaced a distance D1 away from the hologram plate, wherein the first, second, third and fourth HOE are arranged such that the first HOE satisfies θi=θ6 and D4=tan θ6f×D1, the second HOE satisfies θi=θ5 and D4=tan θ5×D1, the third HOE satisfies θi=θ4 and D4=−tan θ4×D1, and the fourth HOE satisfies θi=θ3, D4=−tan θ3×D1 (where θ6 denotes an angle between an optical axis of the composite HOE and an optical axis of the first HOE on yz-plane, θ5 denotes an angle between an optical axis of the composite HOE and an optical axis of the second HOE on yz-plane, θ4 denotes an angle between an optical axis of the composite HOE and an optical axis of the third HOE on yz-plane, and θ3 denotes an angle between an optical axis of the composite HOE and an optical axis of the fourth HOE on yz-plane), and the object beam for the first, second, third and fourth HOE is a converging beam converging onto a point Qi spaced by D3 from an optical axis having an angle θ2' to the optical axis on the xy-plane of the hologram plate and spaced by D5 from an optical axis on the yz-plane of the hologram plate.

11. A holographic memory as claimed in claim 9, wherein the first HOE is disposed such that an optical axis thereof on a xy-plane has an angle θ6 to y-axis and a space thereof to y-axis in +z direction is tan θ6×L5, the second HOE is disposed such that an optical axis thereof on a xy-plane has an angle θ6 to y-axis and a space thereof to y-axis in +z direction is tan θ5×L5, the third HOE is disposed such than an optical axis thereof on a xy-plane has an angle θ4 to y-axis and a space thereof to y-axis in −z direction is tan θ4×L5, and the fourth HOE is disposed such than an optical axis thereof on a xy-plane has an angle θ3 to y-axis and a space thereof to y-axis in −z direction is tan θ3×L5 (where L5 is a distance from the first beam deflector to the composite HOE).

12. A holographic memory as claimed in claim 8, wherein the third beam deflector has the same direction of deflection with the first beam deflector in the first beam path changing unit.

13. A holographic memory as claimed in claim 8, wherein a recording capacity of the hologram memory unit is dependent on a number of the HOEs in the composite HOE.

14. A holographic memory, comprising:

a light source for emitting a beam;

a beam splitter for splitting the beam into a reference beam and an object beam;

a hologram memory unit for recording information on a cell to which the reference beam and the object beam are incident together, and reproducing information recorded previously when only the reference beam is incident thereto;

a first beam path changing unit for directing the reference beam to an arbitrary direction for recording and reproducing the information;

a composite HOE having first, second, third and fourth HOEs (Holographic Optical Element) successively stacked in a vertical direction each for diffracting the reference beam from the first beam path changing unit toward an arbitrary cell of the hologram memory unit wherein the reference beam for the first, second, third and fourth HOE is a diverging beam diverging from a position having an angle $\theta 1'$ to an optical axis on an xy-plane of a hologram plate and an angle $\theta i$ to the optical axis on a yz-plane of the hologram plate and spaced a distance D1 away from the hologram plate, wherein the first, second, third and fourth HOE are arranged such that the first HOE satisfies $\theta i=\theta 6$ and D4=tan $\theta 6 \times D1$, the second HOE satisfies $\theta i=\theta 5$ and D4=tan $\theta 5 \times D1$, the third HOE satisfies $\theta i=\theta 4$ and D4=−tan $\theta 4 \times D1$, and the fourth HOE satisfies $\theta i=\theta 3$, D4=−tan $\theta 3 \times D1$ (where $\theta 6$ denotes an angle between an optical axis of the composite HOE and an optical axis of the first HOE on yz-plane, $\theta 5$ denotes an angle between an optical axis of the composite HOE and an optical axis of the second HOE on yz-plane, $\theta 4$ denotes an angle between an optical axis of the composite HOE and an optical axis of the third HOE on yz-plane, and $\theta 3$ denotes an angle between an optical axis of the composite HOE and an optical axis of the fourth HOE on yz-plane), and the object beam for the first, second, third and fourth HOE is a converging beam converging onto a point Qi spaced by D3 from an optical axis having an angle $\theta 2'$ to the optical axis on the xy-plane of the hologram plate and spaced by D5 from an optical axis on the yz-plane of the hologram plate; and a second beam path changing unit for adjusting a beam path of the object beam such that the object beam is incident to the hologram memory unit for recording the information, comprising, a first beam blocking unit for passing the object beam incident thereto in recording and blocking the object beam incident thereto in reproduction;

a beam deflector for deflecting the object beam passed through the beam blocking unit toward an arbitrary direction;

a beam expander for expanding a diameter of the object beam deflected at the third beam deflector;

a reflector for changing a direction of advance of the object beam expanded by the beam expander;

a light modulator for displaying the object beam incident to the reflector;

a lens for subjecting the object beam displayed on the light modulator to Fourier transformation, to provide to the hologram memory unit; and an optical detector for converting optical information reproduced from the hologram memory unit into an electrical signal in reproduction.

15. A holographic memory as claimed in claim 14, wherein the first beam path changing unit comprises:

a beam expander for expanding a diameter of the reference beam split at the beam splitter;

a reflector for changing a direction of advance of the reference beam expanded at the beam expander;

a first beam deflector for deflecting the reference beam reflected at the reflector to an arbitrary direction; and a second beam deflector for re-deflecting the reference beam deflected at the first beam deflector perpendicular to a deflection direction of the first beam deflector.

16. A holographic memory as claimed in claim 14, wherein the first HOE is disposed such that an optical axis thereof on a xy-plane has an angle $\theta 6$ to y-axis and a space thereof to y-axis in +z direction is tan $\theta 6 \times L5$, the second HOE is disposed such that an optical axis thereof on a xy-plane has an angle $\theta 6$ to y-axis and a space thereof to y-axis in +z direction is tan $\theta 5 \times L5$, the third HOE is disposed such than an optical axis thereof on a xy-plane has an angle $\theta 4$ to y-axis and a space thereof to y-axis in −z direction is tan $\theta 4 \times L5$, and the fourth HOE is disposed such than an optical axis thereof on a xy-plane has an angle $\theta 3$ to y-axis and a space thereof to y-axis in −z direction is tan $\theta 3 \times L5$ (where L5 is a distance from the first beam deflector to the composite HOE).

17. A holographic memory as claimed in claim 14, wherein the beam deflector of the second beam path changing unit has the same direction of deflection with a beam deflector in the first beam path changing unit.

18. A holographic memory as claimed in claim 14, wherein a recording capacity of the hologram memory unit is dependent on a number of the HOEs in the composite HOE.

* * * * *